(12) United States Patent
Matschl et al.

(10) Patent No.: US 7,193,419 B2
(45) Date of Patent: Mar. 20, 2007

(54) MODULAR CASCADED DETUNING CIRCUIT FOR ANTENNAS IN MRI APPARATUSES

(75) Inventors: Volker Matschl, Bamberg (DE); Arne Reykowski, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 91 days.

(21) Appl. No.: 10/997,843

(22) Filed: Nov. 24, 2004

(65) Prior Publication Data

US 2005/0134277 A1    Jun. 23, 2005

(30) Foreign Application Priority Data

Nov. 28, 2003   (DE)   ................. 103 56 274

(51) Int. Cl.
  *G01V 3/00*   (2006.01)
(52) U.S. Cl. ..................... 324/322; 324/318
(58) Field of Classification Search ............... None
  See application file for complete search history.

(56) References Cited

U.S. PATENT DOCUMENTS

| | | | | |
|---|---|---|---|---|
| 4,763,076 A * | 8/1988 | Arakawa et al. | ............ | 324/322 |
| 4,782,298 A * | 11/1988 | Arakawa et al. | ............ | 324/322 |
| 4,833,409 A * | 5/1989 | Eash | ............ | 324/318 |
| 5,243,287 A * | 9/1993 | Hashoian et al. | ............ | 324/318 |
| 5,260,658 A * | 11/1993 | Greim et al. | ............ | 324/322 |
| 5,666,055 A * | 9/1997 | Jones et al. | ............ | 324/318 |
| 6,326,789 B1 * | 12/2001 | Yoshida et al. | ............ | 324/318 |
| 6,414,488 B1 * | 7/2002 | Chmielewski | ............ | 324/311 |
| 6,469,509 B2 * | 10/2002 | Friedrich et al. | ............ | 324/318 |
| 6,677,755 B2 * | 1/2004 | Belt et al. | ............ | 324/322 |
| 6,897,658 B2 * | 5/2005 | Belt et al. | ............ | 324/322 |
| 2002/0080911 A1 * | 6/2002 | Friedrich et al. | ............ | 378/21 |
| 2002/0169374 A1 * | 11/2002 | Jevtic | ............ | 600/422 |
| 2005/0062472 A1 * | 3/2005 | Bottomley | ............ | 324/317 |
| 2005/0099179 A1 * | 5/2005 | Monski et al. | ............ | 324/318 |
| 2005/0134277 A1 * | 6/2005 | Matschl et al. | ............ | 324/322 |
| 2005/0162165 A1 * | 7/2005 | Nistler et al. | ............ | 324/318 |

* cited by examiner

*Primary Examiner*—Brij Shrivastav
*Assistant Examiner*—Tiffany A. Fetzner
(74) *Attorney, Agent, or Firm*—Schiff Hardin LLP

(57) ABSTRACT

A detuning circuit unit for antennas of a magnetic resonance apparatus has at least two identical detuning modules that are connected in a cascade circuit and can be simultaneously activated with a control signal of a control signal source, and a circuit component to terminate a last of the detuning modules of the cascade circuit. An advantage is in the modular and cascadable use of the identical detuning modules, such that PIN diodes used as radio frequency switches are serially fed current in a first operating state and are supplied in parallel with a blocking voltage in a second operating state.

11 Claims, 4 Drawing Sheets

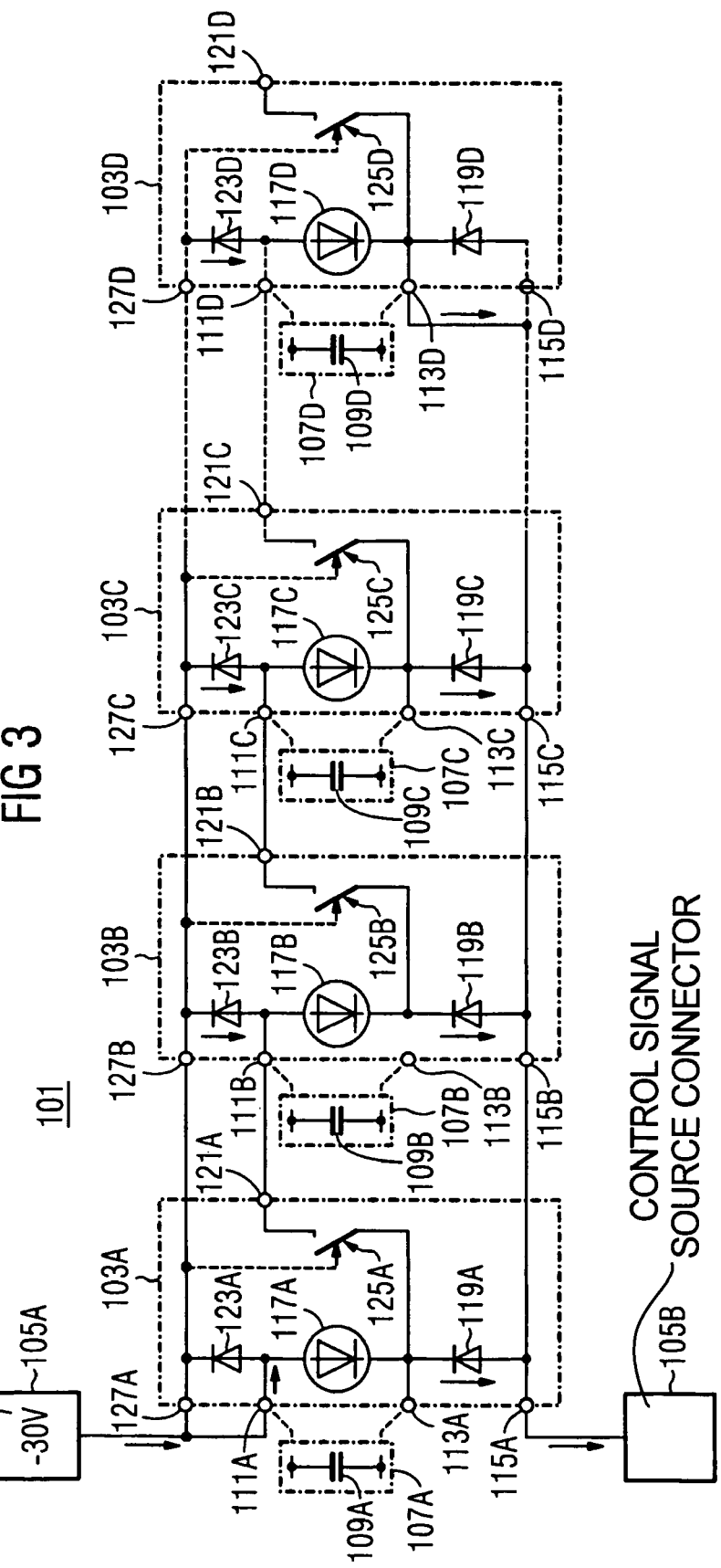

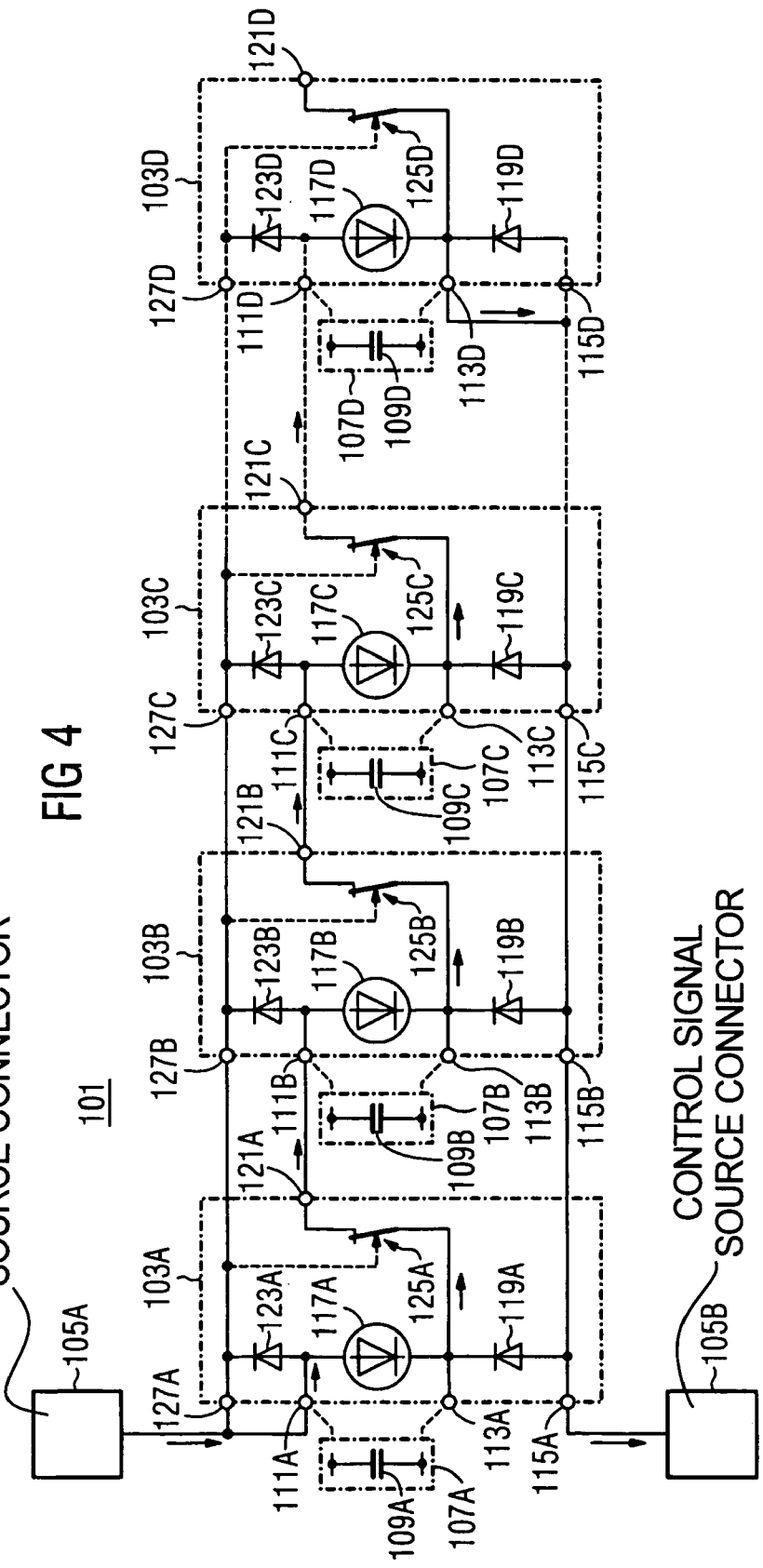

MODULAR CASCADED DETUNING CIRCUIT FOR ANTENNAS IN MRI APPARATUSES

BACKGROUND OF THE INVENTION

1. Field of the Invention

The present invention concerns a detuning circuit unit for antennas in a magnetic resonance apparatus.

2. Description of the Prior Art

Magnetic resonance technology is a known modality to acquire, among other things, images of the inside of the body of an examination subject. In a magnetic resonance (MR) apparatus, rapidly switched gradient fields are superimposed on a static basic magnetic field B0 that is generated by a basic field magnet. To excite MR signals, the MR apparatus also has a whole-body radio frequency antenna (RF antenna) that radiates RF signals (known as the B1 field) into the examination subject. The excited magnetic resonance signals can be acquired by the antennas that emit the aforementioned signals, or by other antennas such as local antennas. The received signals are processed by a computer to reconstruct an image.

Antenna arrays are typically used in MR tomography. An antenna array has a number of individual coil elements. An example of an antenna array is a spinal column surface unit, also called a spine array. In such an antenna array with, for example, eight rows of three coil elements, four rows (twelve coil elements), for example, cover the maximum acquisition volume (field of view, FOV).

If coil elements are not necessary for particular examination, they are detuned with regard to their resonance frequency with the use of detuning circuits. For example, receiving antennas are switched to be inactive during the transmission mode and transmitting antennas are switched to be inactive during the reception mode. The activation of such a detuning circuit typically occupies a control signal line in the plug of the antenna unit. In conventional detuning circuits, a certain forward (on-state) current typically is provided by the MR apparatus in the detuned state (inactive state) via a PIN diode. In the active case, i.e. without detuning, a blocking voltage is applied to the PIN diode.

In addition to the transmission by means of a whole-body antenna mentioned above, a B1 magnetic field an also be radiated with good spatial localization with a local antenna array.

A problem with the use of a number of coil elements in an antenna array is that the number of control signal lines for detuning is limited by the physical size of the plug.

SUMMARY OF THE INVENTION

An object of the present invention is to provide a detuning circuit with a simple design that can be activated externally, which allows a number of coil elements to be activated in common.

This object is inventively achieved by a detuning circuit unit for antennas of a magnetic resonance apparatus with at least two identical detuning modules that are connected in a cascade circuit, which can be simultaneously activated with a control signal of a control signal source, and a circuit component to terminate a last of the detuning modules in the cascade circuit. The detuning modules can be respectively connected with the antennas. The antennas can be, for example, coil elements of a local antenna unit that can be connected with a magnetic resonance apparatus via a cable or can be integrated with the connected antenna units.

An advantage of the invention is that the detuning circuit unit is structured in modules that are identical and thus can be flexibly arranged in the cascade circuit. The invention thus enables the use of an arbitrary number of detuning modules in the cascade circuit. The detuning modules preferably are activated with an identical, or substantially identical control signal.

In an embodiment, each of the detuning modules includes an RF switch, the RF switches being connected serially in a first operating state of the detuning circuit unit and in parallel in a second operating state. A PIN diode is preferably used as an RF switch. PIN diodes have the advantage of being very fast radio frequency switches with microsecond switching times. Given a direct current, they exhibit a conductive state for radio frequency signals, and given a blocking direct voltage they exhibit a blocking state for radio frequency signals. It is thus advantageous for the control signal source to be a direct current/direct voltage source.

In another embodiment of the detuning circuit unit, each of the detuning modules has a first antenna connector and a second antenna connector for connection, respectively, with one of the antennas, a cascade output and a control signal output. The antenna connectors are electrically connected via the PIN diode; and the second antenna connector is connected with the control signal output via a first diode directed opposite to the PIN diode, and is electrically connected with the cascade output via a switching element (in particular a transistor). The switching element is fashioned for activation via the control signal. The switching element preferably is a detuning circuit switching element that, for example, can be activated via the direct current/direct voltage source for activation of the PIN diodes.

This embodiment has the advantage of the detuning module being formed of a minimal number of connectors and thus, due to a compact and simple circuiting possibility, occupies less space on a printed circuit board connecting the detuning modules. The low number of connectors is possible due to the multiple occupation of the connectors. For example, one of the antenna connectors is additionally used as a cascade input and moreover, in the case of the first detuning module in the cascade, as a control signal input.

In a further embodiment, the last detuning module is excluded from the cascade circuit. The cascade output of any of the detuning modules is respectively electrically connected via a cascade connection with the first antenna connector of a following detuning module in the cascade circuit. The is an example for an advantageous multiple occupation of a connector in the cascade circuit.

In a further embodiment, the second antenna connector is electrically connected with the control signal output, except in the last detuning module. This has the advantage that identical modular detuning modules can be used, and only the last of the detuning modules exhibits this external connection as an external circuit.

In another embodiment, the first antenna connector of a first of the detuning modules in the cascade circuit can be connected with a first connector of the control signal source, and the control signal output of any of the detuning modules can be electrically connected with a second connector of the control signal source, or with ground potential.

In an embodiment, in each of the detuning modules the first antenna connector is electrically connected with the cascade output via a second diode. The second diode is connected in a series with the PIN diode, as seen in the same direction as the PIN diode, and the switching element is connected with the first antenna connector for activation via the control signal.

In another embodiment, each of the detuning modules has a control signal input that is electrically connected with the first antenna connector via a second diode. The second diode is connected in series with the PIN diode, as seen opposite the direction of the PIN diode, and the switching element is connected with the control signal input for activation via the control signal.

In a version of this embodiment, the control signal inputs of any of the detuning modules are electrically connected with one another, and the control signal input of the first detuning module is electrically connected with the first antenna connector of the first detuning module. Thus the first of the detuning modules is also externally hardwired into the cascade circuit in addition to the last of the detuning modules.

DESCRIPTION OF THE DRAWINGS

FIG. 3 shows a detuning circuit unit with detuning modules that have five connectors, wherein (as in FIG. 1) the PIN diodes of each of the detuning modules are supplied with a blocking voltage.

FIG. 4 shows the detuning circuit unit from FIG. 3, wherein the PIN diodes are fed current.

DESCRIPTION OF THE PREFERRED EMBODIMENTS

The following, exemplarily represented detuning circuit units according to the invention generally correspond to multiplier circuits of PIN diode control signals. Since each of the PIN diodes is at the same time part of a radio frequency path of an antenna and a direct current path for activation, a decoupling (not indicated in the figures) of both paths ensues via capacitors and inductors. The various identical detuning modules of the detuning circuit unit preferably are mounted on a carrier printed circuit board and connected with one another, or connected with the antennas and the control signal source.

In the aforementioned spinal column coil unit, a detuning circuit unit has, for example, three detuning modules that are respectively connected with one of the three coil elements of the eight rows.

Figure 1:
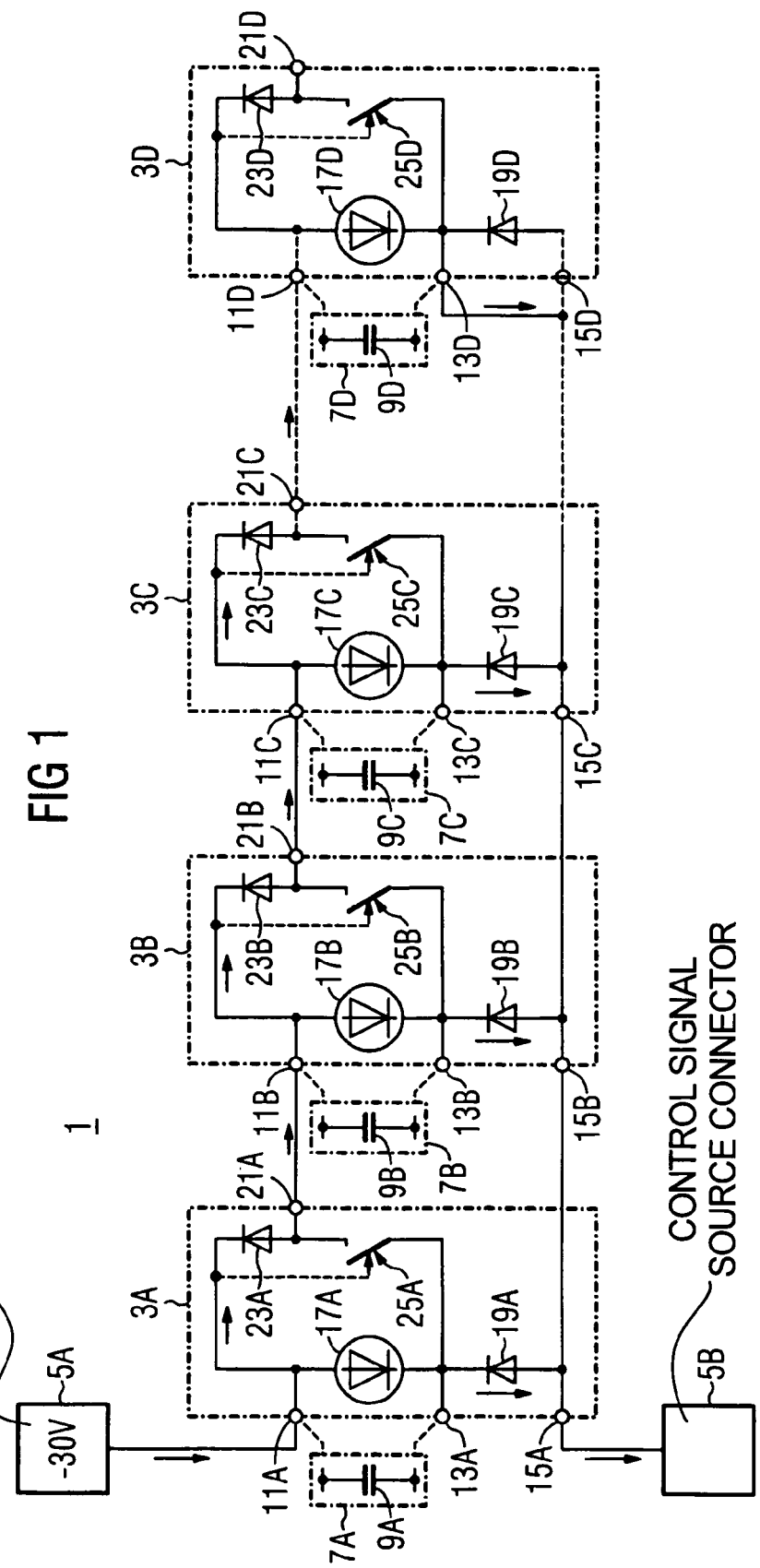
FIG. 1 is an exemplary detuning circuit unit that has a number of identical detuning modules each with four connectors, and in which a PIN diode acting as an RF switch blocks in each detuning module.

In FIG. 1, a detuning circuit unit 1 with a number (four in the example) of identical detuning modules 3A, . . . 3D is schematically shown. The detuning circuit unit 1 is connected with a first connector 5A and a second connector 5B of a control signal source. In the shown case, negative voltage, for example −30V, is applied to the first connector 5A, and the second connector 5B is grounded.

Each of the detuning modules 3A, . . . 3D is connected with a schematically shown antenna 7A, . . . This means that each of the antennas 7A, . . . is connected with a first and a second antenna connector 11A, . . . 13A of one of the detuning modules 3A, . . . 3D. By the use of the detuning modules 3A, . . . 3D, the antennas 7A, . . . can exhibit the two operating states in which the resonance frequencies of the associated oscillating antenna circuits are tuned or detuned.

For example, in the resonant antenna circuits integrated capacitors 9A, . . . are used for detuning. For example, with additional (not shown) inductors, one of the capacitors 9A, . . . forms a blocking resonance circuit with the resonance frequency of the associated antenna 7A, . . . By the use of the corresponding detuning module 3A, . . . 3D, the blocking resonance circuit can be activated and deactivated with the resonance frequency of the respective antenna, with an activated blocking resonance circuit representing a high-ohmic point in the resonant antenna circuit. The detuning alternatively can be effected by a shifting of the resonance frequency. Thus, for example, one of the capacitors 9A, . . . which determines the resonance frequency of the associated oscillating antenna circuit can be bridged with the corresponding detuning module 3A, . . . 3D.

The first connector 5A of the control signal unit is electrically connected with the first antenna connector 11A of the first detuning module 3A, and the second connector 5B of the control unit is electrically connected with the control signal outputs 15A, . . . 15D of the detuning modules 3, . . . 3D. In the last detuning module, an electrical connection between the second antenna connector 13D and the signal output 15D is additionally effected.

In the following, the circuit of the identical detuning modules 3A, . . . 3D is specified in the example of the first detuning module 3A. The first and second antenna connectors 11A, 13A are connected via a PIN diode 17A. The PIN diode 17A serves as a radio frequency switch that, given a direct current, exhibits a conductive state for radio frequency signals and, given a blocking direct voltage, exhibits a blocking state for radio frequency signals. This leads to the two operating states of the detuning module 3A. In FIG. 1, a blocking voltage is present at the diode 17A, such that, for example, the associated blocking resonance circuit is interrupted (deactivated) and the antenna 7A is not detuned. The second antenna connector 13A is electrically connected with the signal output 15A via a first diode 19A directed opposite to the PIN diode 17A. The first antenna input 11A is electrically connected with the cascade output 21A via a second diode 23A, whereby the second diode 23A is connected as a series circuit with the PIN diode 17A, considered in the same direction as the PIN diode 17A.

The second antenna connector 13A is connected with the cascade output 21A via a switching element 25A, for example a transistor. The switching element 25A is connected with the first antenna connector 11A for activation via the control signal. In FIG. 1, the switch 25A is open due to the negative voltage at the first connector 5A of the control unit.

In the situation specified in FIG. 1, the first and second diode 19A, . . . ,23A, . . . of the detuning modules 3A, . . . are conductively connected, such that the PIN diodes 17A, . . . are connected in parallel due to the applied negative voltage and all PIN diodes 17A, . . . are exposed to the same blocking voltage. All detuning modules 3A, . . . , and therewith antennas 7A, . . . , thus are in the same operating state, for example set to receive.

Figure 2:
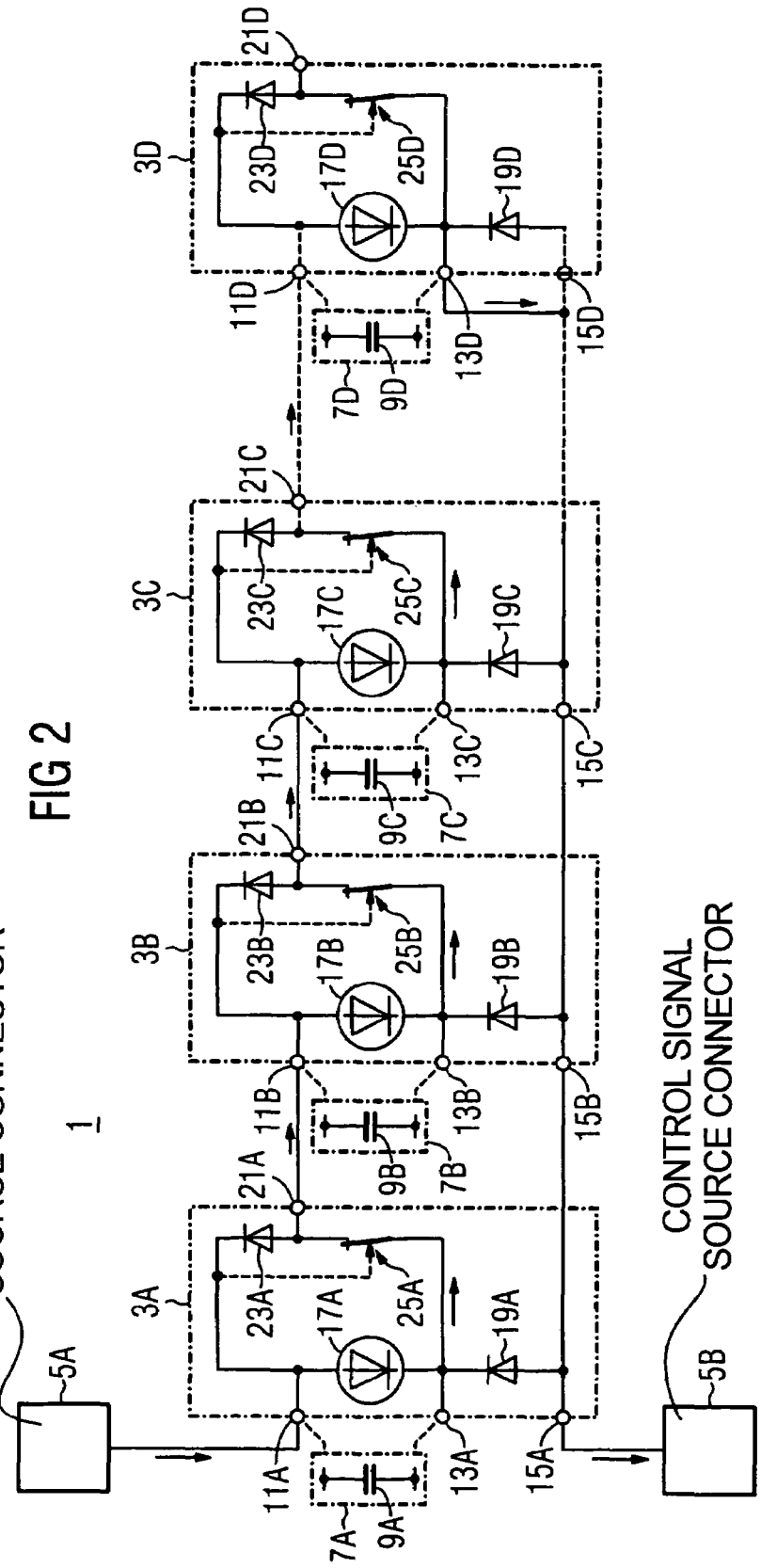
FIG. 2 shows the detuning circuit unit of FIG. 1, wherein the PIN diodes are fed current.

FIG. 2 shows a second operating state for the detuning circuit unit 1 of FIG. 1, in which the PIN diodes 17A, . . . lead to a detuning of the antennas 7A, . . . , in that, for example, they activate the blocking resonance circuit. In this operating state, the signal source feeds current to the detuning circuit unit 1. For example, a direct current of 100 mA flows from the first connector 5A to the second connector 5B via the detuning circuit unit 1. The pole reversal of the connector 5A has the effect that now the switching elements 25A, . . . of the detuning modules 3A, . . . respectively close an electrical connection between the second antenna connectors 13A, . . . and the cascade connectors 21A, . . . The pole reversal furthermore has the effect that the diodes 19A, . . . 23A, . . . block, such that now the PIN diodes 17A, . . . of the detuning modules 3A, . . . are fed with current in a series circuit (cascade circuit). Upon being fed with current in this operating state, the PIN diodes 3A, . . . are serially connected, and the same current flows through every PIN diode 3A, . . .

As a further example, FIGS. 3 and 4 show a detuning circuit unit 101 in a first operating state corresponding to FIG. 1 (FIG. 3) and a second operating state corresponding to FIG. 2 (FIG. 4). The functionality in both operating states is indicated by arrows, as in FIGS. 1 and 2.

The detuning circuit unit 101 likewise has a number of detuning modules 103A, . . . In contrast to the exemplary embodiment in FIGS. 1 and 2, in each detuning module 103A, . . . respectively the second diode 123A, . . . is used for electrical connection of the fist antenna connector 111A, . . . and a control signal input 127A, . . . In this respect, an electrical connection no longer exists in the detuning modules 103A, . . . between the first antenna input 111A, . . . and the cascade output 121A, . . . The control signal input 127A, . . . is a fifth connector of the detuning modules 103A, . . . The control signal inputs 127A, . . . are respectively electrically connected with the first output 105A of the control unit. Additionally, for the first detuning module 103A an electrical connection is established between the control signal input 127A and the first antenna connector 111A in order to short the second diode 123A. The second diode 123A, . . . in the detuning modules 103A . . . is integrated as a series circuit with the PIN diode 117, . . . , considered opposite to the direction of the PIN diode 117A, . . . in the circuit.

In each detuning module 103A, . . . , the switching element 125A, . . . is connected with the control input 127A, . . . for activation via the control signal. For example, a transistor again can be used as a switching element 125A, . . . .

In the operating state of the detuning circuit unit 101 of FIG. 3, a negative voltage of, for example, −30V is again applied to the first connector 105A of the control unit. The second connector 105B is earthed. The diodes 119A, . . . and 123A, . . . are thus conductively connected. The switching elements 125A are open, i.e. there is no electrical connection between the second antenna connector 113A, . . . and the cascade output 121A, . . . The PIN diodes 117A, . . . are correspondingly connected in parallel and a blocking voltage is respectively applied to them. The antenna is thus not detuned, but rather is ready to receive since, for example, the blocking resonance circuits are deactivated or the capacitors 109A, . . . in the antenna units 107, . . . are not shorted.

FIG. 4 shows another operating state of the detuning circuit unit 101, in which the antennas 107A . . . are detuned. For this, the PIN diodes 117A, . . . are fed current, i.e. the capacitors 109A . . . are shorted in terms of radio frequency via the PIN diode. In this operating state, a current of, for example, 100 mA from the first to the second connector 105A, 105B is provided by the control signal source.

Due to the reversed (in comparison with FIG. 3) polarity, on the one hand the diodes 119A, . . . 123, . . . block, and on the other hand the switching elements 125A, . . . close the electrical connections between the second antenna connectors 113A, . . . and the cascade outputs 121A, . . . The PIN diodes 117A, . . . are serially operated in a cascade circuit, whereby the same current flows through the PIN diodes 117A . . . and they assume a conductive state for radio frequency signals.

The diodes 19A, . . . 21A, . . . 119A, . . . and 123A, . . . preferably are passive diodes that become conductive given current or, respectively, voltage. They switching elements preferably are transistors that become conductive upon being fed current (operating states in FIGS. 2 and 4) and open given negative voltages (operating states in FIGS. 1 and 3).

With the shown detuning circuit units 1, 101, an arbitrary number of antennas (i.e., for example, coil elements or antenna units) can be activated with identical detuning modules 3A, . . . ,132, . . . A control signal is necessary for activation. This has the advantage that respectively only one control signal line in the plug is occupied, for example in the activation of a plurality of antennas of an antenna array which is connected with the magnetic resonance apparatus via a plug. The previously mentioned spinal column coil unit thus needs only eight control signal lines in order to detune the respective eight three-way pairs of coil elements.

The detuning circuit units are particularly advantageous due to their identical detuning modules 3A, . . . 103A, . . . that can be arbitrarily cascaded, whereby only the last of the detuning modules 3D, 103D in the cascade (and, under the circumstances, also the first of the detuning modules 103A in the cascade) must be additionally connected from the outside.

Although modifications and changes may be suggested by those skilled in the art, it is the intention of the inventors to embody within the patent warranted hereon all changes and modifications as reasonably and properly come within the scope of their contribution to the art.

We claim as our invention:

1. A detuning circuit unit configured for a plurality of antennas of a magnetic resonance apparatus, comprising:
    at least two identical detuning modules each having connectors respectively configured for connection to a different one of said antennas in said plurality of antennas of said magnetic resonance apparatus;
    said detuning modules being connected together in a cascade circuit allowing simultaneous activation of all of said detuning modules with a single control signal from a control signal source, with one of said detuning modules in said cascade circuit forming a last detuning module of said cascade circuit, each of said detuning modules comprising an RF switch operable by said single control signal, said single control signal causing the respective RF switches of the respective detuning modules to be connected in series in order to place said cascade circuit in a first operating state, and said single control signal causing the respective RF switches to be connected in parallel in order to place said cascade circuit in a second operating state; and
    a circuit component terminating said last detuning module.

2. A detuning circuit unit as claimed in claim 1 wherein each of said RF switchs is a PIN diode.

3. A detuning circuit as claimed in claim 2 wherein said control signal source is a direct voltage/direct current source.

4. A detuning circuit unit as claimed in claim 2 wherein each of said detuning modules comprises a first antenna connector and a second antenna connector, respectively configured for connection to an antenna, a cascade output and a control signal input, said first antenna connectors being electrically connected via the respective PIN diodes of the respective detuning modules, and the respective second antenna connectors being electrically connected to the control signal input via a first diode having a polarity opposite to a polarity of the PIN diode in the detuning module and to said cascade output via said switching element, said switching element being activatable by said single control signal.

5. A detuning circuit unit as claimed in claim 4 wherein, except for said last detuning module, the cascade output of the respective detuning modules is electrically connected via a cascade connection with the first antenna connector of the following detuning module in the cascade circuit.

6. A detuning circuit unit as claimed in claim 4 wherein said circuit component terminating the last detuning module comprises an electrical connection between the second antenna connector and the control signal input of the last detuning module.

7. A detuning circuit unit as claimed in claim 4 wherein the first antenna connector of a first of the detuning modules in said cascade circuit is connected with a first connector of the control signal source, and wherein the control signal input of each of the detuning modules in the cascade circuit is electrically connected with a second connector of the control signal source.

8. A detuning circuit unit as claimed in claim 4 wherein the first antenna connector of a first of the detuning modules in said cascade circuit is connected with a first connector of the control signal source, and wherein the control signal input of each of the detuning modules in the cascade circuit is electrically connected to ground.

9. A detuning circuit unit as claimed in claim 4 wherein, in each of said detuning modules, the first antenna connector is electrically connected with the cascade output via a second diode, said second diode being connected in series with the PIN diode as seen in a same direction as the PIN diode, and the switching element is connected with the first antenna connector permitting activation by said single control signal.

10. A detuning circuit unit as claimed in claim 4 wherein, in each of the detuning modules, the control signal input is electrically connected with the first antenna connector via a second diode, the second diode being connected in series with the PIN diode, as seen in a direction opposite to the PIN diode, and the switching element is connected with the control signal input permitting activation by the single control signal.

11. A detuning circuit unit as claimed in claim 10 wherein the respective control signal inputs of the detuning modules are electrically connected to each other, with the control signal input of a first of the detuning modules in the cascade circuit being electrically connected with the first antenna connector of said first of said detuning modules.

\* \* \* \* \*